US006070256A

United States Patent [19]
Wu et al.

[11] Patent Number: 6,070,256
[45] Date of Patent: May 30, 2000

[54] METHOD AND APPARATUS FOR SELF-TESTING MULTI-PORT RAMS

[75] Inventors: Yuejian Wu, Kanata; Sanjay Gupta, Nepean, both of Canada

[73] Assignee: Nortel Networks Corporation, Montreal, Canada

[21] Appl. No.: 09/026,339

[22] Filed: Feb. 19, 1998

Related U.S. Application Data

[60] Provisional application No. 60/047,944, May 29, 1997.

[51] Int. Cl.[7] .............................. G11C 29/00; G01R 31/28
[52] U.S. Cl. ......................... 714/718; 714/733; 365/201; 365/230.05
[58] Field of Search ..................................... 714/718, 720, 714/733, 734, 736, 745; 365/201, 230.05

[56] References Cited

U.S. PATENT DOCUMENTS

| | | | |
|---|---|---|---|
| 5,040,150 | 8/1991 | Naitoh et al. ............................ | 365/201 |
| 5,442,642 | 8/1995 | Ingalls et al. ........................... | 714/733 |
| 5,481,671 | 1/1996 | Fujisaki ...................................... | 714/8 |
| 5,812,469 | 9/1998 | Nadeau-Dostie et al. .............. | 365/201 |

OTHER PUBLICATIONS

"Testing Semiconductor Memories: Theory and Practice", A.J. van de Goor, John Wiley & Sons Ltd., England, 1991, pp.364–369.
"Serial Interfacing for Embedded Memory Testing", B. Nadeau–Dostie et al., IEEE Design and Test of Computers, Apr. 1990, pp.52–63.
"An Efficient Test Method for Embedded Multi–port RAM with BIST Circuitry", T. Matsumura, Records of the 1995 IEEE International Workshop on Memory Tech. Design and Testing, San Jose, CA., 1995, pp.62–67.
"Dual Port Static RAM Testing", M.J. Raposa, Proc. IEEE International Test Conference, 1988, pp. 362–368.
"A 5 Gb/s 9–Port Application Specific SRAM with Built–In Self Test", S.W. Wood et al., Records of the 1995 IEEE International Workshop on Memory Tech. Design and Testing, San Jose, CA., Aug. 1995, pp. 68–73.
"Testing Complex Couplings in Multiport Memories", M. Nicolaidis, IEEE Transactions on Very Large Scale Integration (VLSI) Systems, vol. 3, No. 1, New York, Mar. 1995, pp. 59–71, XP000500302.
"Built–In Self–Test for Multi–Port RAMs", Y. Wu et al., Proceedings 6th Asian Test Symposium, Akita, Japan, Nov. 17, 1997, pp. 398–403, XP002069408.

*Primary Examiner*—Emmanuel L. Moise
*Attorney, Agent, or Firm*—Angela C. de Wilton

[57] ABSTRACT

A method for and apparatus of testing a multi-port RAM (random access memory) detect single port faults and inter port shorts in multi-port random access memories. The algorithm performs a conventional single-port test such as MARCH or SMARCH on one port of the memory and performs an inter-port test on all other ports. The algorithm does not impose any extra test time and requires the addition of only a few gates to a conventional single-port BIST controller, independently of the size of the memory. An address to select ports of the multi-port RAM includes a row address signal of a plurality of bits. A specific bit of the row address signal is changed.

7 Claims, 9 Drawing Sheets

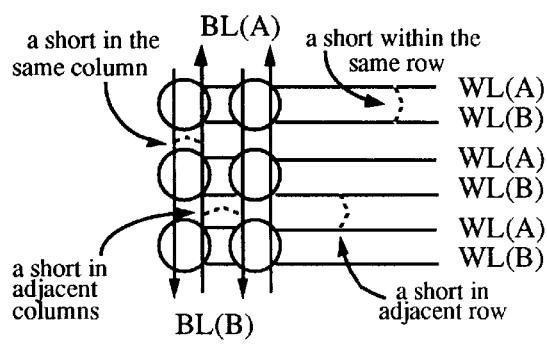
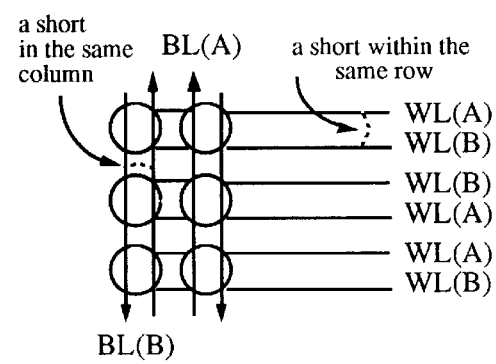
**FIG. 1A
(Prior Art)**
**FIG. 1B
(Prior Art)**

METHOD AND APPARATUS FOR SELF-TESTING MULTI-PORT RAMS

This application is a continuation of provisional application Ser. No. 60/047,944 filed May 29, 1997.

TECHNICAL FIELD

The present invention relates to a method and apparatus for self-testing of multi-port random access memories (RAMs).

BACKGROUND OF THE INVENTION

Embedded multi-port RAMs have wide-ranging applications in telecommunication and multi-processor systems. Due to the limited access to embedded memories from the external pins of an ASIC, Built-In Self-Test (BIST) is a preferable test for RAMs. Typical BIST algorithms are MARCH algorithm [A. J. van de Goor, Testing Semiconductor Memories: Theory and Practice, John Wiley & Sons Ltd., England, 1991] and SMARCH algorithm [B. Nadeau-Dostie, A. Silburt and V. K. Agarwal, "Serial Interfacing for Embedded Memory Testing", IEEE Design and Test of Computers, April 1990, p. 52].

Most multi-port memory BIST algorithms treat the memory as multiple individual single-port memories and test each independently using the algorithms developed for single-port RAMs. A major problem with this approach is the lack of coverage for some multi-port specific defects, such as inter-port interferences due to shorts across ports.

Modified MARCH algorithms were proposed to detect inter-port shorts by T. Matsumura, "An Efficient Test Method for Embedded Multi-port RAM with BIST Circuitry", Records of the 1995 IEEE Int. Workshop on Memory Tech. Design and Testing, San Jose, Calif., pp. 62–67, 1995, and M. J. Raposa, "Dual Port Static RAM Testing", Proc. IEEE Int. Test Conf., pp. 362–368, 1988. The algorithm tests pairs of ports by simultaneously performing a MARCH test with ascending addresses on one port and another MARCH test with descending addresses on the other port. The test covers all word line shorts and bit line shorts but only within the same row or column. The test may also impose substantial silicon area for routing due to the need to provide different addresses to the two ports.

A paper by S. Wood, R. Gibson, S. Adham, and B. Nadeau-Dostie entitled "A 5 Gb/s 9-Port Application Specific SRAM with Built-In Self-Test", Records of the 1995 IEEE Int. Workshop on Memory Tech. Design and Testing, San Jose, Calif., pp. 68–73, August 1995, discloses shadow write test. In the shadow write test, when a port is placed in shadow write mode, its write drivers continuously force a constant value on all bit lines with its word lines internally disabled. Thus, if no short exists between this port and the port under test, no memory cell will be affected by the shadow write. On the other hand, if an inter-port short does exist, the value read out from the port under test will be affected by the value driven from the shadow write. The shadow write requires design and layout modification.

SUMMARY OF THE INVENTION

It is an object of the present invention to provide an improved apparatus and method for self-testing a multi-port RAM.

According to one aspect of the present invention, there is provided a method for testing a multi-port RAM (random access memory) comprising RAM cells of m rows by n columns, each RAM cell including storage means for storing binary data, the rows and columns of the RAM cells being addressed by an address signal, the method comprising the modification step of modifying the address identified by the address signal provided to the selected ports of the multi-port RAM.

According to another aspect of the present invention, there is provided an apparatus for testing a multi-port RAM comprising RAM cells of m rows by n columns, each RAM cell including storage means for storing binary data, the rows and columns of the RAM cells being addressed by an address signal, the apparatus further comprising address modifier means for modifying the address identified by the address signal provided to the selected ports of the multi-port RAM.

BRIEF DESCRIPTION OF THE DRAWINGS

Embodiments of thee present invention will now be described by way of example with reference to the accompanying drawings in which:

FIGS. 1A and 1B show examples of bit line and word line shorts;

DETAILED DESCRIPTION

I. Fault Models

The following discusses fault models that are specific to multi-port memories, namely bit line and word line shorts across ports.

(i) Bit Line Shorts

In general, a bit line short across ports is any bridging fault that shorts a bit line of one port to a bit line of another port. In practice, bit lines that are physically far apart cannot be shorted and only bit line shorts within the same and adjacent columns are most likely.

FIGS. 1A and 1B show some examples of inter-port bit line shorts in two different layout styles for a memory with two ports: A and B. In FIG. 1A, both bit line shorts within the same column and between adjacent columns are possible. However, if the bit lines are mirror imaged, as shown in FIG. 1B, then only inter-port bit line shorts within the same column are possible.

(ii) Word Line Shorts

Similarly to bit line shorts, the most likely inter-port word line shorts are word line shorts within the same row and between adjacent rows. If the word lines are laid out as in FIG. 1A, both types of word line shorts can occur. For the layout style shown in FIG. 1B, only an inter-port short within the same row is possible. A short between adjacent rows can occur only for the same port, and is easily detected by many conventional single-port BIST algorithms. These inter-port word line shorts can be further categorized into a) WSA shorts defined as a short between an asserted and unasserted word line that asserts both word lines; and b) WSD shorts defined as a short between an asserted and unasserted word line that deasserts both word lines. WSA and WSD word line shorts in the same row as well as between adjacent rows will be examined.

Shadow write test for bit line and word line shorts across ports of multi-port memories is disclosed in co-pending U.S. patent application Ser. No. 08/667,828 filed by S. Wood et al on Jun. 20, 1996, now abandoned, U.S. patent application Ser. No. 08/719,306 filed by R. G. Gibbins et al on Sep. 19, 1996, now U.S. Pat. No. 5,742,557 and U.S. patent application Ser. No. 08/719,301 filed by G. F. R. Gibson on Sep. 18, 1996, now U.S. Pat. No. 5,734,613 which are incorporated herein by reference.

II. First Embodiment

II-1. Circuit Configuration

Figure 2:
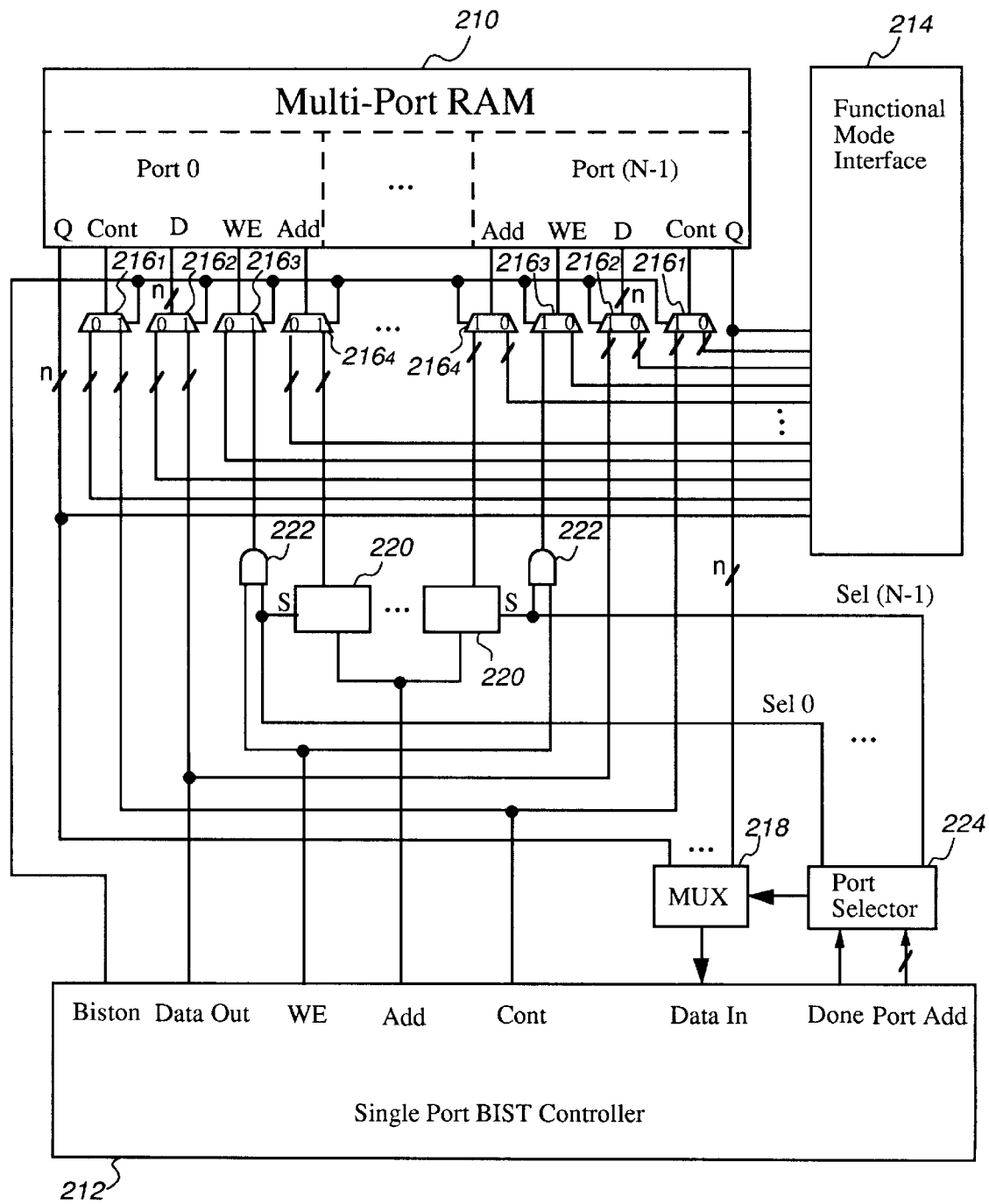
FIG. 2 is a block diagram of a test apparatus according to one embodiment of the present invention.

FIG. 2 shows one embodiment connected to a multi-port RAM. In FIG. 2, a RAM 210 is an N-port (e.g., 5 ports) memory and is tested by a BIST controller 212 and a functional mode interface 214. The RAM 210 includes RAM cells of a plurality of rows and columns. Each RAM cell includes a data storage element for storing binary data. The rows and columns of the RAM cells are addressed by an address signal. The RAM 210, at each port, has a data output terminal Q, a control terminal Cont, a data input terminal D, a write enable terminal WE and an address terminal Add. The functional mode interface 214 is connected to N groups of selectors $216_1$–$216_4$, each of the groups being contacted to the terminals of the respective port of the RAM 210. The N data output terminals Q of the RAM 210 are connected to a multiplexer 218, the output terminal of which is connected to a test data input terminal Data In of the BIST controller 212. A control terminal Cont of the BIST controller 212 is connected to one of the two input terminals of each of the N selectors $216_1$. An address terminal Add of the BIST controller 212 is connected to input terminals of N address modifiers 220. The output terminal of each address modifier 220 is connected to the input terminal of the respective selector $216_4$. A write enable terminal WE of the BIST controller 212 is connected to input terminals of N AND gates 222. The output terminal of each AND gate 222 is connected to the input terminal of the respective selector $216_3$. A test data out terminal Data Out of the BIST controller 212 is connected to the input terminals of the N selectors $216_2$. A bist on terminal Biston of the BIST controller 212 is connected to the selector terminals of the N groups of the selectors $216_1$–$216_4$. A done terminal Done and a port address terminal Port Add of the BIST controller 212 are connected to a port selector 224, the N output terminals of which are connected to the N address modifiers 220 and the N AND gates 222. The write enable terminal WE is a single-bit line. The data input terminal D and the data output terminal Q are n-bit wide. Lines shown by/are multiple bit wide.

Figure 3:
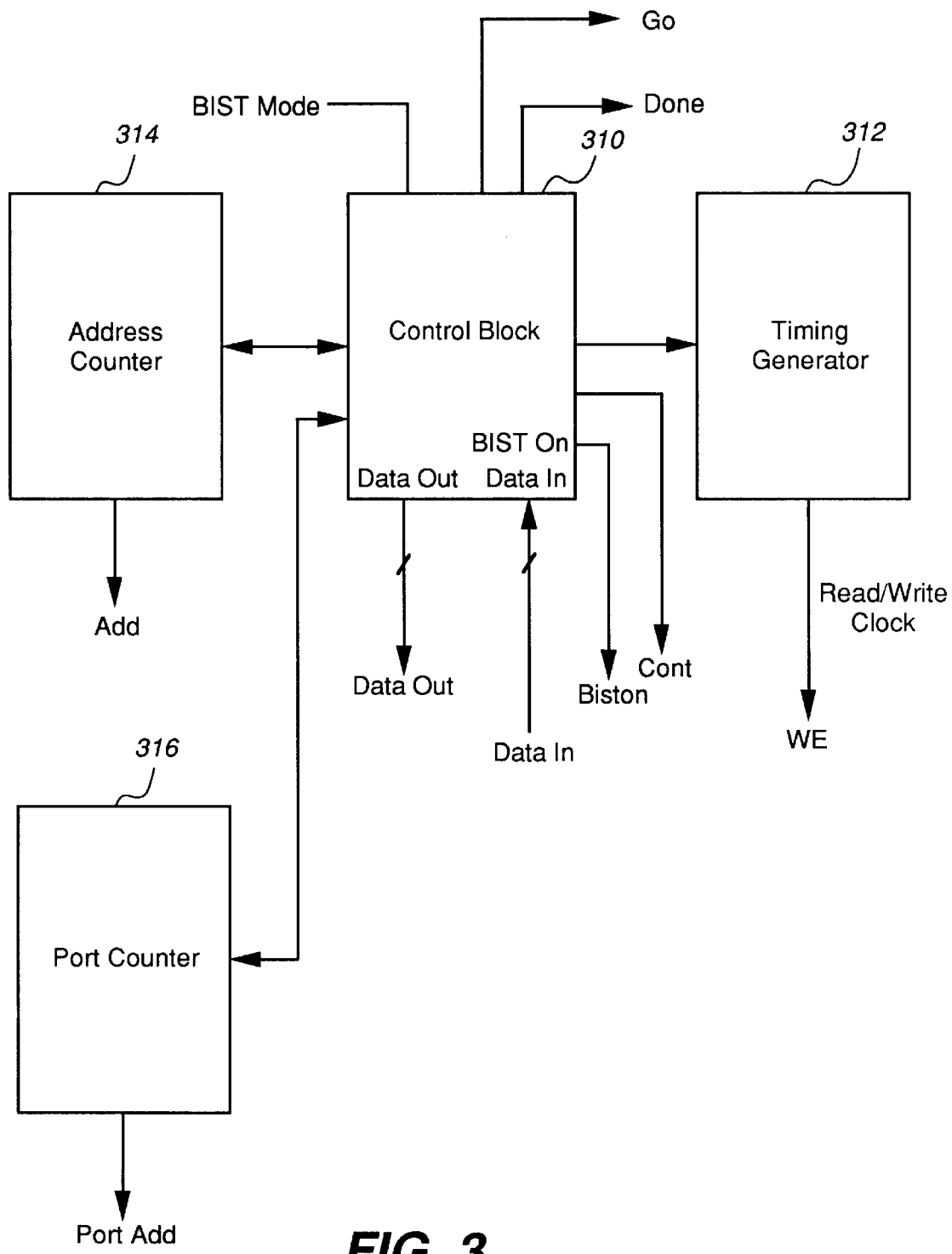
FIG. 3 is a block diagram of a BIST controller shown in FIG. 2.

FIG. 3 shows an example of the BIST controller 212. The BIST controller 212 includes a control block 310, a timing generator 312, an address counter 314 and a port counter 316. The BIST controller 212 is a conventional one and its detail in structure and operation is found in B. Nadeau-Dostie, A. Silburt and V. K. Agarwal, "Serial Interfacing for Embedded Memory Testing", IEEE Design and Test of Computers, April 1990, p. 52, at 58 and 59, which is hereby incorporated by reference.

Figure 4:
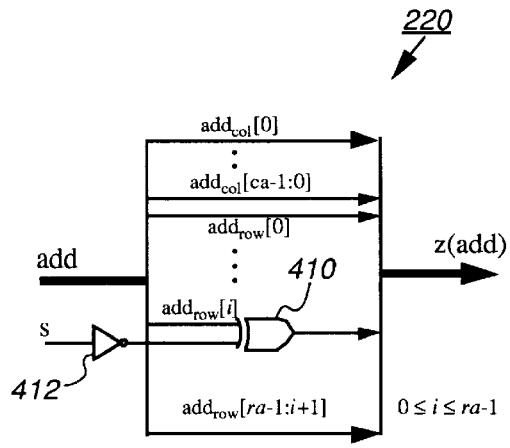
FIG. 4 shows an implementation of an address modifier shown in FIG. 2.

FIG. 4 shows an example of the address modifier 220 shown in FIG. 2. The address modifier 220 includes an exclusive OR gate 410 and an inverter 412. The input terminal of the inverter 412 is connected to the respective output terminal of the port selector 224 of FIG. 4 and receives a respective selection signal Sel 0, Sel 1, - - - , or Sel (N–1). FIG. 4 is a implementation of the address modifier 220 of $Y=2^i$, $0 \leq i$, where Y is a parameter to be defined later.

II-2. Operation of the Embodiment

Operation of the test apparatus shown in FIG. 2 will now be described, referring to FIGS. 2–4.

In test mode, the BIST controller 212 asserts signal Biston to select the test data for the RAM as opposed to selecting the data from the functional mode interface 214. The testing of the RAM 210 works as follows.

When the BIST controller 212 tests port 0 of the RAM, the port selector 224 asserts signal Sel 0 and de-asserts all other port select signals Sel 1, . . . , Sel (N–1). The asserted Sel 0 sensitizes the write enable signal WE to port 0. It also puts the address modifier 220 for port 0 into a by-pass mode such that the address from the BIST controller 212 is directly applied to the address terminals of port 0. On the other hand, the de-asserted port select signals Sel 1, . . . , Sel (N–1) will disable the write enable signal WE to the corresponding ports. In addition, they will also put the corresponding address modifier 220 into a transformation mode such that the address from the BIST controller 212 is modified in the address modifier 220 and then applied to the address terminals of the corresponding ports. Furthermore, the port selector 224 will also instruct the multiplexer 218 to select only the test response data from port 0 to the BIST controller 212 for evaluation.

Once the above signals are set, the BIST controller 212 performs a single-port test algorithm. The basic principle of the algorithm is to perform a conventional single-port BIST, in this case MARCH on one port of the memory, say port 0, while simultaneously conducting an inter-port test on all other ports. The inter-port test performs pseudo read operations on addresses different from those on port 0. Unlike a real read operation, which addresses the specified memory cells and compares their contents to some reference data, a pseudo read only accesses the specified memory cells without comparing their contents. These pseudo-read operations allow the detection of inter-port bit line shorts in the same and adjacent columns as well as WSA and WSD word line shorts in the same and adjacent rows through the single-port BIST on port 0. By repeating the test for every other port in turn the operation of all ports and their interactions can then be verified.

Pseudo-code for the multi-port BIST algorithm for a memory with N ports is presented below.

Notations d is any valid data to the memory. For example, if checker-board pattern is desired, d=0101 . . . 0101.

(Rd)@add and $(R\overline{d})$@add represent read d and $\overline{d}$ operations at the address add of the read port, respectively.

(Rx)@z(add) represents a pseudo read operation at the address z(add) of the read port.

$(R\overline{d})$@add (Rx)@z(add) represents a read $\overline{d}$ operation at the address add followed a pseudo read operation (Rx) at the address z(add) of the read port.

$(W\text{-}W\overline{d})$@add and (W-Wd)@add represent a don't write cycle (denoted as W-) followed by write $\overline{d}$ and d operations respectively into the write port at the address add. The don't write cycle (W-) is basically a null operation on the write port with the write-enable disabled.

(RdW$\bar{\text{d}}$)@add and (R$\bar{\text{d}}$Wd)@add represent a read d followed by a write $\bar{\text{d}}$ both at address add and a read $\bar{\text{d}}$ followed by a write d both at add, respectively.

i: (RdW$\bar{\text{d}}$)@add and i: (R$\bar{\text{d}}$Wd)@add represent to perform (RdW$\bar{\text{d}}$)@add and (R$\bar{\text{d}}$Wd)@add for port i, respectively.

Finally, two events enclosed in a pair of square bracket [. . . , . . .] are two simultaneous events. For example, [i: (RdW$\bar{\text{d}}$)@add, j: (RxRx)@z(add)] indicates to perform (RdW$\bar{\text{d}}$) at address add for port i and simultaneously perform (RxRx) at address z(add) for port j.

With the notations defined above, the algorithm can be summarized as follows:

---

Algorithm P

M0: initialize memory with data d;
M1: for port i = 0 to N-1 do
M2:  for address add = 0 to w-1 do
       [i: (RdW$\bar{\text{d}}$)@add, j: (RxRx)@z(add)], ∀j ≠ i;
M3:  for address add = 0 to w-1 do
       [i: (R$\bar{\text{d}}$Wd)add, j: (RxRx)@z(add)], ∀j ≠ i;
M4:  for address add = w-1 down to 0 do
       [i: (RdW$\bar{\text{d}}$)@add, j: (RxRx)@z(add)], ∀j ≠ i;
M5:  for address add = w-1 down to 0 do
       [i: (R$\bar{\text{d}}$Wd)@add, j: (RxRx)@z(add)], ∀j ≠ i;
M6:  for address add = w-1 down to 0 do
       [i: (RdW$\bar{\text{d}}$)@add, j: (RxRx)@z(add)], ∀j ≠ i;

---

In the algorithm above, z(add)={col, [row+(-1)$^{\lfloor row/Y \rfloor}$Y]} if add={col, row}, where col and row represent the column and row addresses respectively; Y is a positive integer and $\lfloor row/Y \rfloor$ is the result of an integer division. It is noted that without the operations on ports j, the algorithm is the same as the MARCH C- algorithm.

Because of the address transformation to the ports other than port i, this single-port test algorithm will now cover not only all the conventional single-port faults in port i, but also all the inter-port shorts between port i and any other port j, j≠i.

Figure 5:
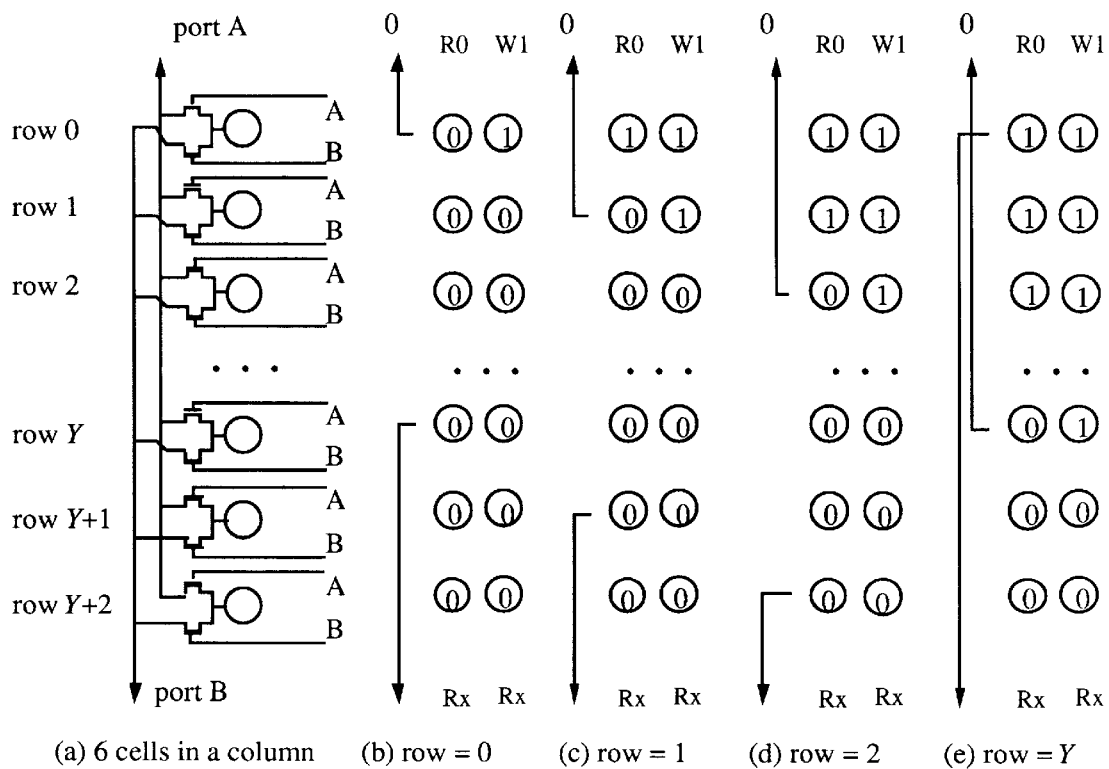
FIG. 5 shows an example execution of one step performed by the BIST controller.

FIG. 5 shows the execution of the above algorithm (an example of step M2) on several memory cells in the same column of a dual-port memory. It is assumed that d=0 and that port A is under the MARCH test. FIG. 5, (b)–(e) depict the execution of step M2 of the algorithm on row addresses 0, 1, 2, and Y, respectively, and will be used to analyze the coverage of bit line and word line shorts. In order for the analysis on the above four rows to be applicable to all other addresses, row Y+2 is also included in FIG. 5, (a)–(e). The first column in FIG. 5, (b)–(e) show the contents of the memory cells after the R0 operation on port A, while the second column shows the contents of the cells after the W1 operation. For now, we assume that Y>1. Later in this section, we will discuss the case for Y=1.

(i) Bit-line shorts

First consider a bit line short within the same column. Clearly, this short will cause write data from port A to be also written incorrectly into the cell addressed by port B. For example, in FIG. 5, (b), the (R0W1) operation on row 0 from port A will also write a 1 into row Y which will be detected when a (R0W1) is subsequently performed on row Y. In addition, such a short will also cause a conflict X to appear on port A when port A performs a (R0) on row Y and port B performs a (Rx) on row 0 since a 0 from row Y and a 1 from row 0 will both occur on the bit line for port A due to the short.

A bit line short across adjacent columns can also be detected in a similar manner. For instance, if a bit line short exists between columns 0 and 1, the (R0W1) operation on row 0 and column 0 from port A will also write a 1 into the cell in row Y and column 1, which will then be detected when port A subsequently accesses column 1.

(ii) Word-line shorts in the same row

Figure 6:
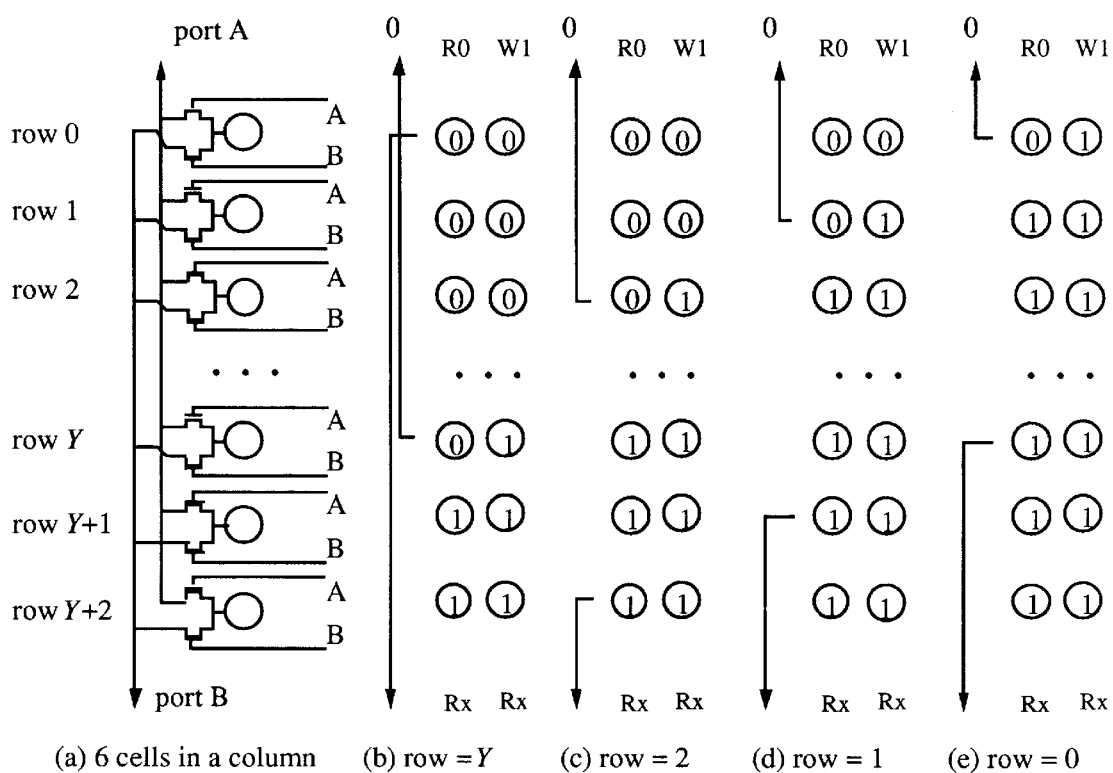
FIG. 6 shows an example execution of another step performed by the BIST controller.

Consider word line shorts in the same row. A WSD word line short in row 0, i.e. a short that de-asserts word line A, causes an unknown value X to be read on port A and also prevents port A from writing a 1 into this row. On the other hand, a WSA short in row 0, i.e. a short that asserts both word lines A and B, will cause a conflict X to occur on port A when port B conducts a (Rx) on row 0 and port A performs a (R0) on row Y (FIG. 5, (e)). Furthermore, this short will be detected more robustly in steps M4 and M5 of the algorithm, during which an incorrect value will be written into row 0 when port A conducts a (R0W1) or (R1W0) on row Y and port B accesses row 0. This is illustrated in FIG. 6, (b) which shows execution of step M4. Similarly, other word line shorts within the same row are detected.

(iii) Word-line shorts across adjacent rows

Similarly to WSD word line shorts within the same row, WSD shorts across adjacent rows are also easily detectable since they always cause the port under the MARCH test to read an unknown value X and also prevent it from writing to the addressed row.

Now consider a WSA word line short between row 0's word line B and row 1's word line A. Such a short will cause a conflict X to occur on port A when port B accesses row 0 and port A performs a read on row Y (FIG. 5, (e)). Moreover, an incorrect 1 will be written into row 1 during step M4 when port B addresses row 0 and port A performs a W1 on row Y, which is shown in FIG. 6, (b). Similarly, a WSA short between row 1 and row 2 will be detected.

If there exists a WSA short between row Y and row Y+1, when port A addresses row 0 and port B addresses row Y, row Y+1 will also be selected from port A due to the short. This results in a conflict X due to a 0 from row 0 and a 1 from row Y+1 in step M4, which is shown in FIG. 6, (e). Furthermore, during step M2, an incorrect 1 will be written into row Y+1 when port A performs a W1 on row 0 and port B addresses row Y as shown in FIG. 5, (b).

From the analysis above, it can be concluded that the proposed algorithm detects all word line shorts in the same and adjacent rows as well as all bit line shorts in the same and adjacent columns.

In general, it is desirable to keep Y as small as possible since the row address space of the memory must be divisible by 2Y. Therefore, Y=2 is the best choice since it was assumed in the above analysis that Y>1. For the case where Y=1, the algorithm covers both inter-port bit line shorts in the same column and across columns as well as inter-port word line shorts in the same row. However, the algorithm with Y=1 covers only 50% of the inter-port word line shorts across adjacent rows. The reason is as follows. For Y=1, when port A accesses row j and port B addresses row j+1, or vice versa, where j is an even integer, if a word line short exists between rows j and j+1, it will never be detected because the two word lines shorted always set assigned with the same value. This can be seen from FIG. 5, (a), imagining a short between the row 0's word line B and row 1's word line A. On the other hand, a short between rows j+1 and j+2 are covered in the same manner as for the case where Y>1. Therefore, when inter-port word line shorts across adjacent rows are not of concern, due to careful layout as shown in FIG. 1B for example, Y=1 becomes the best choice.

Once the test is complete, the BIST controller 212 will increment the port selector 224 to select another port by asserting signal Sel i, where 0<i<N, and de-asserting all the others. The process repeats until all the ports have been tested.

The test apparatus has the following two key characteristics:

1. when it tests port i for single-port faults, it applies a set of modified addresses to all the other ports and put all these other ports in read mode;
2. it evaluates only the test data coming back from the port under the single-port test, i.e., port i in this case (but one can also evaluate the test data from other ports at the same time since the reference data for these ports are known).

It should be pointed out that some of the functional modules such as address modifier 220, the AND gates 222, the multiplexer 218 and the port selector 224 can be placed externally or internally to the BIST controller 212. However, for easy routing, it is recommended to place the address modifier 220 and the AND gates 222 close to the RAM and place the multiplexer 218 and port selector 224 close to or inside the BIST controller 212.

III. Second Embodiment

Figure 7:
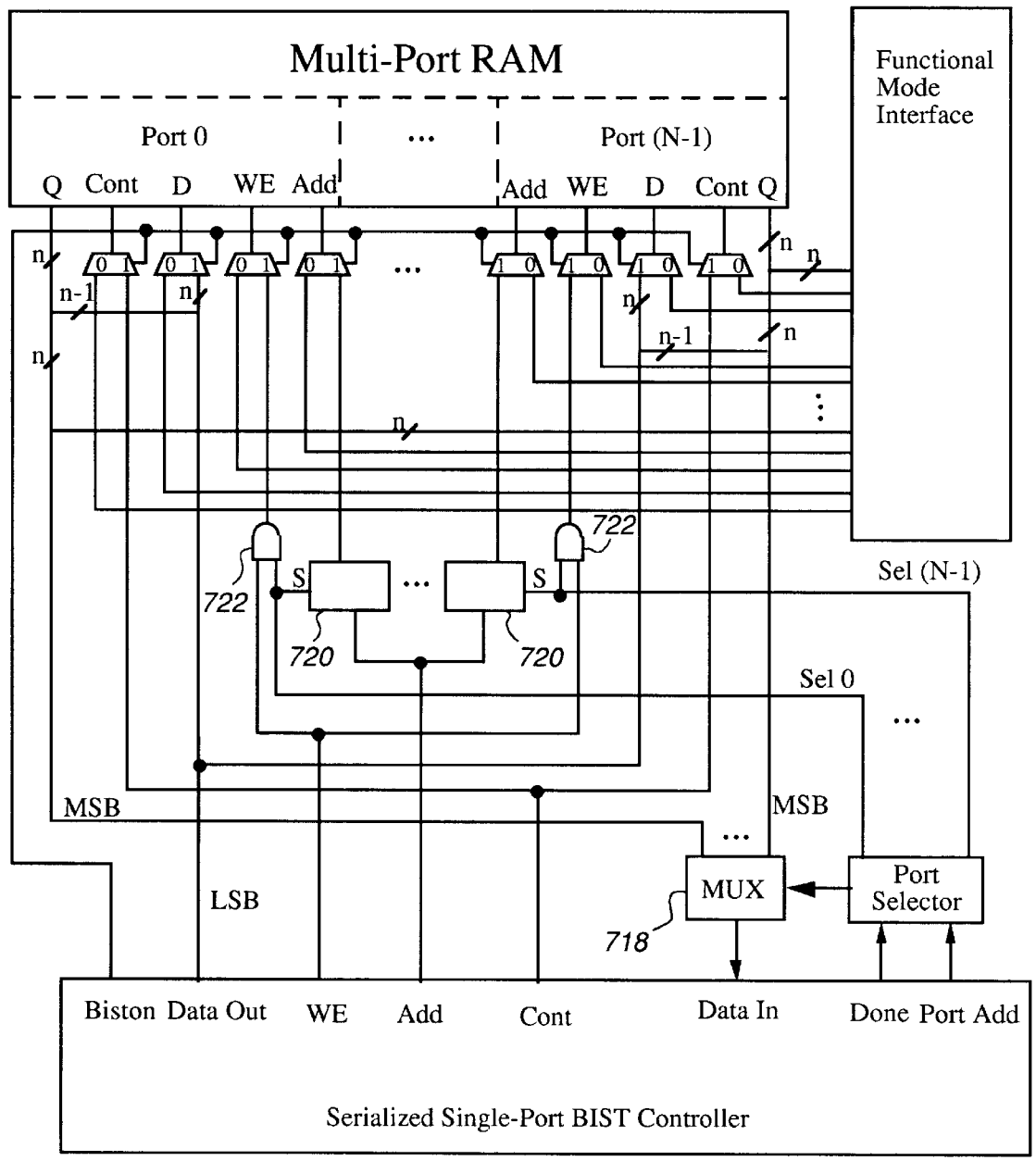
FIG. 7 is a block diagram of a test apparatus according to another embodiment of the present invention.

FIG. 7 shows another embodiment. In order to minimize hardware overhead, a single BIST controller can often be used to test a number of memories. However, if these memories are widely dispersed on an ASIC, a shared parallel BIST controller can be expensive due to the cost of globally routing the data bus. A serialized memory BIST controller (SMARCH) minimizes this overhead by providing only a 1-bit test input to all the memories and receiving a 1-bit test response from each memory. The invention can also be used to test multi-port RAMs in the serialized fashion. A serialized implementation of the invention is shown in FIG. 7.

The serialized implementation of the invention is similar to the parallel implementation shown in FIG. 2. The differences include the following:

1. the serialized version has only a 1-bit test data going to the least significant bit (LSB) of the data input (D terminal) of each port. The rest of the data bus comes from Q of the corresponding port. This is the same as described in SMARCH.
2. the serialized version has only 1-bit test data coming back from the most significant bit (MSB) of the data output (Q terminal) of each port, through a multiplexer 718. The rest of the Q bus goes to the data input of the same port. This connection is also the same as described in SMARCH.

The algorithm presented in Section 3 can easily be extended to work with the serial SMARCH test. The serialized multi-port algorithm (called Algorithm S) can be generated from algorithm P by replacing all (RdW$\overline{d}$) and (R $\overline{d}$Wd) operations on port i with (RdW$\overline{d}$)$^n$(R$\overline{d}$W $\overline{d}$) and (R $\overline{d}$Wd)$^n$(RdWd) respectively, and replacing all (RxRx) operations on port j by (RxRx)$^n$(RxRx). In Algorithm S, d is either binary 0 or 1. Here, a (RdW$\overline{d}$)$^n$ implies reading d from the MSB of the memory and then writing $\overline{d}$ to the LSB of the memory n times, where n is the word width of the memory, while a (RdW$\overline{d}$) implies performing the operations only once.

If the operations on ports other than port j are excluded, then once again the serialized multi-port algorithm S is the same as the SMARCH algorithm. The coverage of algorithm S for inter-port shorts is the same as that of Algorithm P. Also since the serialization affects only the data bus, the hardware required to implement the serialized multi-port algorithm in addition to a conventional SMARCH controller is the same as that for Algorithm P.

In comparison with SMARCH, the distinctiveness of the embodiments of FIGS. 2 and 7 is due to the inclusion of the address modifiers 220 and 720 and the AND gates 222 and 722. The distinctiveness provides the embodiments with the full coverage of not only the conventional single-port faults, but also inter-port shorts while the invention described in SMARCH covers only the conventional single-port faults.

IV. Other Implementations

Figure 8:
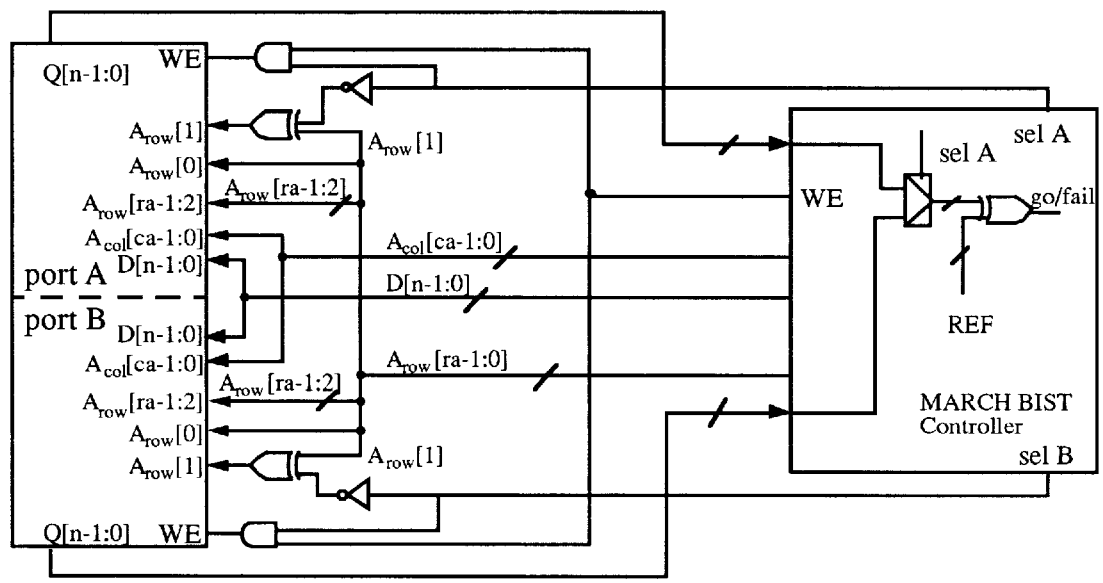
FIG. 8 shows BIST implementation of the algorithm.

FIG. 8 shows one possible implementation for a dual-port memory. This section discusses a possible implementation for the case where Y=2. The implementation is straightforward because of the similarity in the addresses provided to all the ports. FIG. 8 shows one possible implementation for a dual-port memory, where $A_{col}$[ca−1:0] is the column address bus of width ca, $A_{row}$[ra−1:0] is the row address bus of width ra and D[n−1:0] and Q[n−1:0] are n-bit wide input and output data buses respectively. Signals Sel A and Sel B are port selects for ports A and B respectively and WE is the write enable. The MARCH BIST controller shown in FIG. 8 is a conventional single-port parallel MARCH BIST controller.

For the port under the inter-port test, its (LSB+1) bit of the row address, $A_{row}$[1], is inverted, which is equivalent to performing [row+(−1)$^{\lfloor row/2 \rfloor}$2]. In addition, its write enable is disabled. All other signals are the same to both ports.

This implementation requires the addition of only two exclusive OR gates, two AND gates and two inverters to a conventional MARCH BIST controller without requiring any modification to the controller itself (in general, the costs include only one exclusive OR gate, one AND gate and one inverter per port of the memory). In addition, the area overhead is independent of the size of the memory and does not affect the datapath. Also, there is no impact on global routing if the additional gates are placed local to the memory.

It should be pointed out that FIG. 8 only shows the connection or data flows in test mode. The selectors shown as $216_1$–$216_4$ (see FIG. 2) are omitted here for simplicity.

In general, the implementation for the case where Y=$2^k$ (with k≧0) is similar to the one shown in FIG. 8, by inverting $A_{row}$[k] for the ports under inter-port test as opposed to $A_{row}$[1] as shown in FIG. 8.

Figure 9:
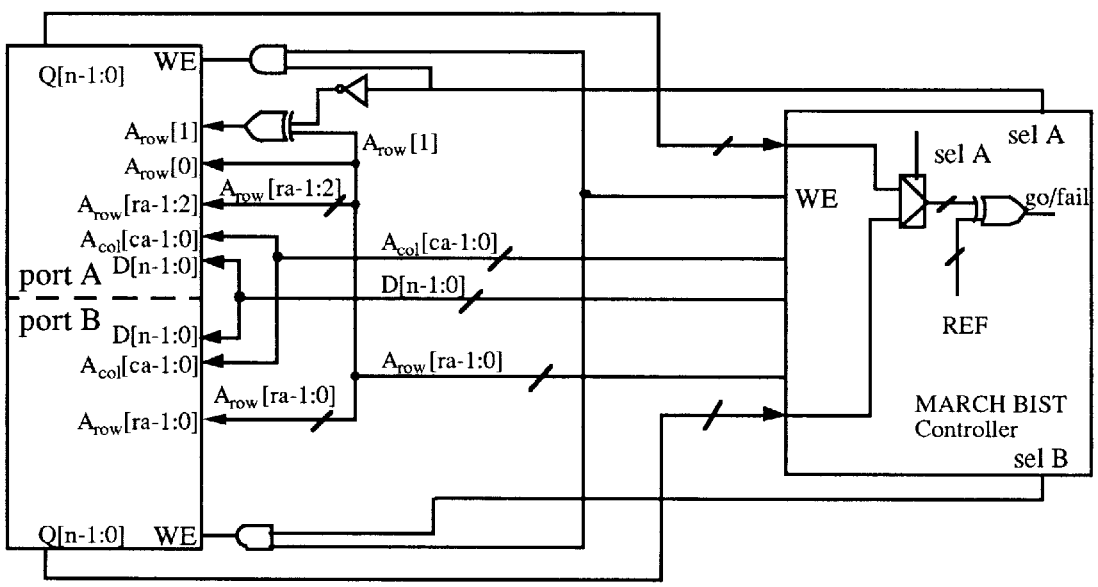
FIG. 9 shows another example of BIST implementation of the algorithm.

Another possible embodiment of the present invention when applied to a two port memory is shown in FIG. 9.

Detection of Inter-Port Shorts Across Two Read-Only Ports

In the algorithm, it has been assumed that all ports are read/write ports. However, the proposed algorithms are also capable of testing inter-port shorts across two read-only ports. To test for such shorts, one of the read-only ports is provided with the same address as the port under MARCH or SMARCH test (which can be a read/write port or a write-only port), while the other read-only port is provided the modified address for the inter-port test. This will still detect all the bit line and word line shorts in the same and adjacent rows and columns. However, the fault coverage may not be as robust as for read/write ports. The reason is as follows: For read/write ports, a short is detected both during the read and write operations on the port under the MARCH test. In general, a write operation is powerful enough to overwrite any read operation from another port if a short exists. For read-only ports, the short can only be detected by a conflict X during a read operation, which may or may not be interpreted as an incorrect value by the read circuitry.

V. BIST for Dual-Port RAMs with Write-Only and Read-Only Ports

Another test algorithm covers the inter-port bridging faults in a two-port memory with a read-only and a write-only ports in addition to conventional single-port faults.

(i) Fault Models

The test covers the conventional single port faults, inter-port shorts. In the following, we will first present the algorithm for the example of a dual-port RAM with a read-only and a write-only ports.

(ii) Algorithm

This section presents a modified MARCH algorithm that covers the inter-port shorts in addition to the faults covered by conventional MARCH test. For simplicity yet without sacrificing generality, this report assumes to test a 2-port memory with one read-only port and one write-only port. There are the same notations as the above mentioned ones. Here, [(RdRx)@add, (W-W$\overline{d}$)@add] indicates to perform (RdRx) on the read port and (W-W$\overline{d}$) on the write port simultaneously, all at the same address add.

With the notations defined previously, the proposed algorithm can be summarized as follows:

```
M0: initialize memory with all data d;
M1: for address add = 0 to w-1 do
    [Rd)@add (Rx)@z(add), (W-Wd)@add];
M2: for address add = 0 to w-1 do
    [(Rd)@add (Rx)@z(add), (W-Wd)@add];
M3: for address add = w-1 down to 0 do
    [(Rd)@add (Rx)@z(add), (W-Wd)@add];
M4: for address add = w-1 down to 0 do
    [(Rd)@add (Rx)@z(add), (W-Wd)@add];
M5: for address add = w-1 down to 0 do
    [(Rd)@add (Rx)@z(add), (W-Wd)@add];
```

Note that the above algorithm becomes the MARCH C-algorithm described in A. J. van de Goor, Testing Semiconductor Memories: Theory and Practice, John Wiley & Sons Ltd., England, 1991, if the address z(add) is replaced with add and each pseudo read Rx is replaced with a null operation on the read-only port.

(iii) BIST Implementation

Figure 10:
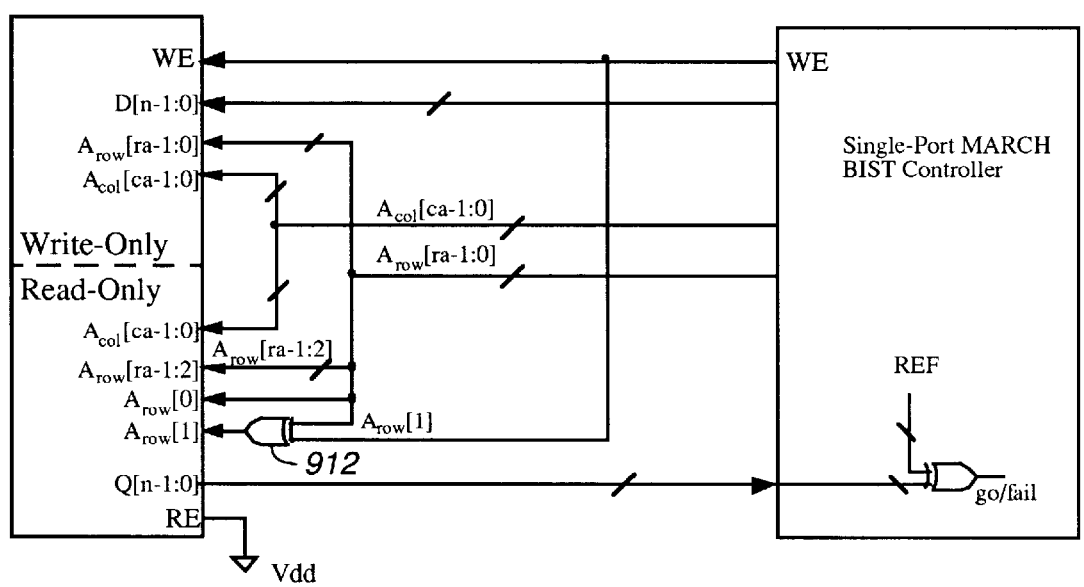
FIG. 10 is a block diagram of a test apparatus according to another embodiment of the present invention.

The implementation of the proposed algorithm is straight-forward. FIG. 10 shows a possible implementation for a dual-port memory with a read-only and a write-only ports. In FIG. 10, an address modifier of an exclusive OR gate 912 is connected to the read-only port of the dual-port memory.

In FIG. 10, WE is write-enable (active high) and RE is read-enable (active high); D[n-1:0] is input data bus to the write port and Q[n-1:0] is the output data bus from the read-only port, with n being the word width; $A_{row}$[ra-1:0] and $A_{col}$[ca-1:0] respectively represent the row and column address buses, with ra and ca being their corresponding bus width; the single-port MARCH controller executes a conventional MARCH C- like test. During the whole test period, the read enable (RE) is asserted. This assures a pseudo read operation to be performed whenever a write operation occurs on the write port.

During the execution of the algorithm, the exclusive OR gate 912 becomes a buffer when WE=0 (W-cycle) and becomes an inverter when WE=1 (W$\overline{d}$ or Wd cycle). When WE=0, a regular read operation is performed at the address add provided by the BIST controller. When WE=1, it modifies the address on the read-only port to z(add)={col, [row+(-1)$^{\lfloor row/2 \rfloor}$2]}. Thus, Wd (or W$\overline{d}$) writes into the write port at the address add and simultaneously a pseudo read Rx addresses the memory cells at address z(add). If a inter-port short exists, the simultaneous write and pseudo read operation will incorrectly write into the memory cells at address z(add).

(iv) Extension to Multi-Port Memories

Figure 11:
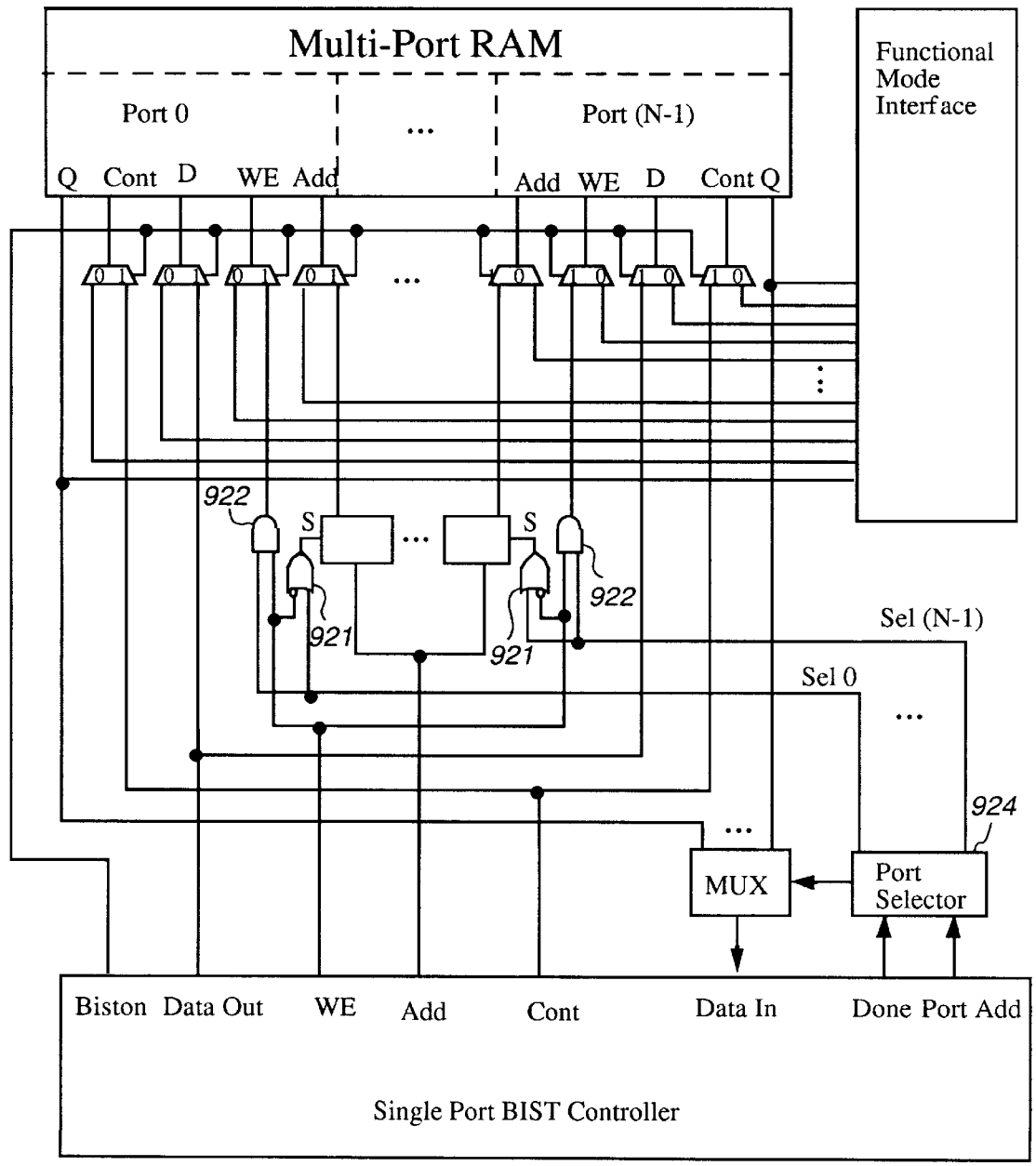
FIG. 11 is a block diagram of a test apparatus according to another embodiment of the present invention.

The above technique is also applicable to memories with multiple ports in any combination of read/write, read-only and write-only. In this case, it covers not only conventional single port faults and inter-port shorts but also multi-port read disturb faults, which is also special to multi-port memories. A read disturb fault is one that when multiple ports read the same memory cell simultaneously the content of the cell is changed or the data read out is not correct. A possible implementation is shown in FIG. 11. The circuit structure shown in FIG. 11 is similar that of FIG. 2. In FIG. 11, an OR gate 921 having an inverting input and a non-inverting input is added. The inverting input of the OR gate 921 is connected to the write enable terminal WE of the BIST controller and an input terminal of an AND gate 922. The non-inverting input terminal of the OR gate 921 is connected to Sel 0 output of a port selector 924 and the other input terminal input of the AND gate 922. Again, this algorithm can be implemented as parallel BIST or serialized BIST.

What is claimed is:

1. A method of testing a multi-port RAM (random access memory) comprising RAM cells of m rows by n columns, each RAM cell including storage means for storing binary data, the rows and columns of the RAM cells being addressed by an address signal comprising a row address signal having a plurality of bits, the method comprising the step of inverting the second least significant bit of the row address signal of the address signal provided to the selected ports of the multi-port RAM.

2. An apparatus for testing a multi-port RAM comprising RAM cells of m rows by n columns, each RAM cell including storage means for storing binary data, the rows and columns of the RAM cells being addressed by an address signal of a plurality of bits, the apparatus comprising address modifier means for modifying a specific bit of the row address signal of the address signal provided to the selected ports of the multi-port RAM.

3. The apparatus of claim 2, wherein the address modifier means inverts the second least significant bit of the row address signal.

4. The apparatus of claim 2, wherein the RAM has a plurality of ports which are read and/or write ports.

5. The apparatus of claim 2, wherein the RAM is a dual-port RAM.

6. The apparatus of claim 2, wherein the dual-port RAM has a write-only port and a read-only port.

7. The apparatus of claim 2, further comprising means for enabling the address modifier means when a port writes the RAM.

* * * * *